(12) United States Patent
Satoh

(10) Patent No.: US 8,525,176 B2
(45) Date of Patent: Sep. 3, 2013

(54) THIN FILM TRANSISTOR, DISPLAY DEVICE USING THE SAME, AND THIN FILM TRANSISTOR MANUFACTURING METHOD

(75) Inventor: Eiichi Satoh, Osaka (JP)

(73) Assignee: Panasonic Corporation, Osaka (JP)

( * ) Notice: Subject to any disclaimer, the term of this patent is extended or adjusted under 35 U.S.C. 154(b) by 92 days.

(21) Appl. No.: 13/186,564

(22) Filed: Jul. 20, 2011

(65) Prior Publication Data
US 2012/0018728 A1 Jan. 26, 2012

(30) Foreign Application Priority Data
Jul. 21, 2010 (JP) .................. 2010-164366

(51) Int. Cl.
H01L 29/786 (2006.01)
H01L 21/336 (2006.01)

(52) U.S. Cl.
USPC .......... 257/59; 257/57; 257/72; 257/E29.273; 438/158

(58) Field of Classification Search
USPC ............... 438/158; 257/57, 59, 72, E29.273, 257/E21.411
See application file for complete search history.

(56) References Cited

U.S. PATENT DOCUMENTS

| 7,420,209 B2 * | 9/2008 | Suzawa et al. .................. 257/59 |
| 2008/0142800 A1 | 6/2008 | Arai et al. |
| 2009/0020759 A1 | 1/2009 | Yamazaki |
| 2010/0038646 A1 | 2/2010 | Arai et al. |

FOREIGN PATENT DOCUMENTS

| JP | 6-188422 | 7/1994 |
| JP | 2000-164883 | 6/2000 |
| JP | 2007-305701 | 11/2007 |
| JP | 2009-49384 | 3/2009 |

* cited by examiner

Primary Examiner — Roy Potter
(74) Attorney, Agent, or Firm — Wenderoth, Lind & Ponack, L.L.P.

(57) ABSTRACT

A TFT includes a supporting substrate, a gate electrode formed on the supporting substrate, a gate insulation film formed on the substrate so as to cover the gate electrode, a first semiconductor layer formed across from the gate electrode with respect to the gate insulation film, a second semiconductor layer formed on the first semiconductor layer, and having a first thickness and a second thickness which is greater than the first thickness, an ohmic contact layer formed on the second semiconductor layer, and a source electrode and a drain electrode formed on the ohmic contact layer, spacing apart with each other.

16 Claims, 13 Drawing Sheets

THIN FILM TRANSISTOR, DISPLAY DEVICE USING THE SAME, AND THIN FILM TRANSISTOR MANUFACTURING METHOD

BACKGROUND OF THE INVENTION (1) Field of the Invention

The present invention relates to thin-film transistors (TFTs), display devices which use the TFTs, and manufacturing methods of the TFTs.

(2) Description of the Related Art

Among actively developed flat panel displays (FDPs), one of common types of display apparatuses is a display apparatus employing organic electro luminescence (EL) elements or liquid crystal display (LCD) elements.

Recently, an organic EL display apparatus using current-driven organic EL elements has caught the attention as a display apparatus of the next generation. In particular, an active-matrix-driven organic EL apparatus uses field-effect transistors (FETs). One of common types of the FETs is a thin-film transistor (TFT). In a TFT, a semiconductor layer is provided on a substrate having an insulating surface. Such a layer works as a channel forming region (hereinafter referred to as a channel layer).

In order to form a TFT to be used for an active-matrix-driven organic EL apparatus, at least the following transistors are required: a switching transistor for controlling driving timing such as on and off of the organic EL element, and a driving transistor for controlling a luminescence amount of the organic EL element. Preferably, the TFT has excellent transistor characteristics, and various studies are on going to achieve such characteristics.

For example, the switching transistor has to further reduce the off-current and decrease the variation between the on-current and the off-current. The driving transistor has to further increase the on-current, and reduce the variation in the on-current.

Furthermore, for example, an amorphous silicon film is used as the channel layer of the TFT. Such an amorphous silicon film, however, has a low mobility, and thus the on-current is low. Thus, in order to ensure the driving performance of the TFT; namely the on-current, studies and developments are proceeding in recent years to achieve crystallization of the amorphous silicon film by heating with a laser beam.

In the case where the crystallized silicon film is used for the TFT, however, the channel layer has left damaged when an ohmic contact layer is formed on the channel layer and processed. This damage leads to deterioration in characteristics of the TFT.

As a technique to reduce the damage to the channel layer when an ohmic contact layer is processed, proposed is a technique to form an insulation film in the TFT as an etching stopper film (See Japanese Unexamined Patent Application Publication No. 2007-305701 for example). Japanese Unexamined Patent Application Publication No. 2007-305701 discloses a TFT having an insulation film working as a protective film, and formed on a crystallized silicon film acting as a channel layer.

SUMMARY OF THE INVENTION

Unfortunately, the TFT disclosed in Japanese Unexamined Patent Application Publication No. 2007-305701 suffers from the deterioration of the TFT. In the TFT, specifically, the ohmic contact layer and the crystallized silicon film are directly in contact with each other. This structure develops a problem of causing concentration of electric fields between the crystallized silicon film and the ohmic contact layer, followed by an increase in the off-current.

The present invention is conceived in view of the above problems and has an object to provide a TFT which reduces the off-current as well as ensures the on-current, a display apparatus using the TFT, and a manufacturing method of the TFT.

In order to solve the above problems, a TFT according to an aspect of the present invention includes: a substrate; a gate electrode formed above the substrate; a gate insulation film formed on the substrate so as to cover the gate electrode; a first semiconductor layer formed across from the gate electrode with respect to the gate insulation film; a second semiconductor layer (i) formed on the first semiconductor layer, and (ii) having a first thickness and a second thickness greater than the first thickness; an ohmic contact layer formed on the second semiconductor layer; and a source electrode and a drain electrode formed on the ohmic contact layer, spacing apart with each other.

The present invention provides a TFT which reduces the off-current as well as ensures the on-current, a display apparatus using the TFT, and a manufacturing method of the TFT.

FURTHER INFORMATION ABOUT TECHNICAL BACKGROUND TO THIS APPLICATION

The disclosure of Japanese Patent Application No. 2010-164366 filed on Jul. 21, 2010 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Described hereinafter are a TFT according to embodiments of the present invention, a manufacturing method of the TFT, and a displaying apparatus including the TFT with reference to the drawings. It is noted that each drawing is a schematic view for the description. Thus, a film thickness and a ratio of the size of each unit are not necessarily precise.

Embodiment 1

Figure 1:
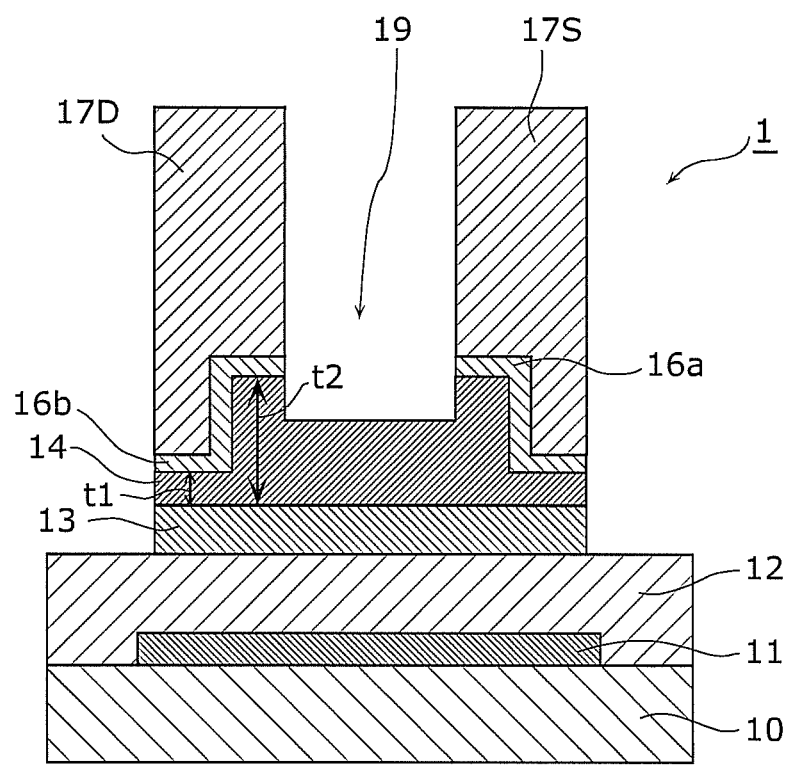
FIG. 1 depicts a cross-sectional view of a TFT according to Embodiment 1.

First, a TFT according to Embodiment 1 of the present invention shall be described with reference to FIG. 1. FIG. 1 depicts a cross-sectional view of the TFT according to Embodiment 1.

A TFT 1 in FIG. 1 is n-type and bottom-gated. The TFT 1 includes: a supporting substrate 10, a gate electrode 11 formed on the supporting substrate 10, a gate insulation film 12 formed over the gate electrode 11, a first semiconductor layer 13 and a second semiconductor layer 14 formed above the gate insulation film 12, a pair of ohmic contact layers 16a and 16b each separately formed on the second semiconductor layer 14, and a source electrode 17S and a drain electrode 17D formed on the pair of the ohmic contact layers 16a and 16b.

Moreover, the TFT 1 includes a separating part 19 for separating (i) the source electrode 17S and the drain electrode 17D, (ii) the ohmic contact layers 16a and 16b, and (iii) a part of the second semiconductor layer 14. The separating part 19 is formed to have a width of approximately 4 μm to 20 μm.

The supporting substrate 10 is, for example, an insulating substrate including a glass substrate made of a glass material such as silica glass. It is noted that an undercoating film, which is not shown, may be formed on the surface of the supporting substrate. Made of a silicon nitride (SiN) film, the undercoating film prevents impurities included in the supporting substrate 10, such as sodium and phosphorus, from entering a semiconductor film.

Made of molybdenum (Mo), for example, the gate electrode 11 is a electrode having a pattern fabricated in strips. The gate electrode 11 may be made of a metal other than Mo, such as molybdenum-tungsten (MoW) for example. It is noted that, in the case where the manufacturing process of the TFT 1 includes a heating process, a preferable material for the gate electrode 11 is a metal material with a high melting point which is resistant to thermal alteration.

The gate insulation film 12 is formed over the supporting substrate 10 to cover the gate electrode 11. The gate insulation film 12 may be made of silicon dioxide ($SiO_2$) for example. Other than $SiO_2$, the gate insulation film 12 may be made of silicon nitride (SiN) or silicon oxynitride (SiON). The gate insulation film 12 may also be made of a film having SiN and SiON laminated with each other. In addition, the gate insulation film 12 is formed by the plasma chemical vapor deposition (plasma CVD) technique. The film thickness of the gate insulation film 12 is approximately 75 nm to 500 nm.

Preferably, the gate insulation film 12 may be made of $SiO_2$. Use of $SiO_2$ as a material for the gate insulation film 12 provides an excellent interfacial state between the gate insulation film 12 and the channel layer (the first semiconductor layer 13 in particular). This excellent interfacial state keeps excellent threshold voltage characteristics in the TFT 1.

Above the gate electrode 11, the first semiconductor layer 13 is patterned insularly on the gate insulation film 12. In other words, the first semiconductor layer 13 is formed across from the gate electrode 11 with respect to the gate insulation film 12. The first semiconductor layer 13 may be formed of a crystalline silicon film, which contributes to an increase in the on-current of the TFT 1. In addition, the first semiconductor layer 13 has a film thickness of approximately 20 nm to 30 nm.

The first semiconductor layer 13 may be formed of a crystalline silicon film made of crystalline silicon.

It is noted that the crystalline silicon film may be made of microcrystalline silicon or amorphous silicon, instead of the crystalline silicon. The first semiconductor layer 13 may be made in a structure of mix crystal including a non-crystalline structure and crystalline structure. The crystalline silicon film may be made of amorphous silicon. The amorphous silicon is crystallized by thermal annealing to form the crystalline silicon film. The crystalline silicon film made of microcrystalline silicon has a crystal grain size of equal to 1 μm or smaller.

The second semiconductor layer 14 is formed between (i) the first semiconductor layer 13 and (ii) the ohmic contact layers 16a and 16b. Specifically, as shown in FIG. 1, the second semiconductor layer 14 is formed to share interfaces with (i) the first semiconductor layer 13 and (ii) the ohmic contact layers 16a and 16b. In other words, the second semiconductor layer 14 is directly laminated on the first semiconductor layer 13 with nothing interposed therebetween. The ohmic contact layers 16a and 16b are directly laminated on the second semiconductor layer 14 with nothing interposed therebetween.

Moreover, the second semiconductor layer 14 has a lower mobility of carriers than the first semiconductor layer 13 has. Specifically, the second semiconductor layer 14 is formed of, for example, an amorphous silicon film made of amorphous silicon. The second semiconductor layer 14 is formed with, for example, the plasma CVD technique. The second semiconductor layer 14 is capable of relaxing the electric field and reducing the off-current.

As shown in FIG. 1, the second semiconductor layer 14 is formed to have a recess and a projection respectively having a first thickness t1 and a second thickness t2. The first thickness t1 and the second thickness t2 respectively represent a thickness of an end portion and a thickness of a center portion of the second semiconductor layer 14. As shown in FIG. 1, the second thickness t2 is greater than the first thickness t1. The separating part 19 is formed on a part of the second semiconductor layer 14 having the second thickness t2, since the second semiconductor layer 14 is etched in its manufacturing process.

Preferably, the first thickness t1 and the second thickness t2 differ with each other between 50 nm and 300 nm inclusive. That much difference of the thicknesses prevents the transistor characteristics from deteriorating when the ohmic contact layers 16a and 17b are etched in their processing. In contrast, suppose the case where the difference of the thicknesses (t2−t1) is smaller than 50 nm: When the ohmic contact layers 16a and 16b are etched, the first semiconductor layer 13 would be inevitably etched together with the second semiconductor layer 14 due to etching variations. Furthermore, suppose the case where the difference of the thicknesses (t2−t1) is equal to 300 nm or greater: When the second semiconductor layer 14 is processed to have the first thickness t1 and the second thickness t2, the processing variations become excessively great, and the transistor characteristics suffers excessive variations.

The ohmic contact layers 16a and 16b are formed on the second semiconductor layer 14. Specifically, the ohmic contact layers 16a and 16b are formed between (i) the second semiconductor layer 14 and (ii) the source electrode 17S and the drain electrode 17D. It is noted that the ohmic contact layers 16a and 16b are used, and an ohmic contact is provided between (i) the source electrode 17S and the drain electrode 17D and (ii) the second semiconductor layer 14.

The ohmic contact layers 16a and 16b are formed of an amorphous silicon film having impurities doped. Using the plasma CVD technique, for example, the ohmic contact layers 16a and 16b are formed to have a film thickness of approximately 10 nm to 100 nm inclusive. As n-type impurities, the ohmic contact layers 16a and 16b are formed, for example, by doping a group V element, such as phosphorus. As p-type impurities, the ohmic contact layers 16a and 16b are formed, for example, by doping a group III element, such as boron (B).

It is noted that, similar to the second semiconductor layer 14, the separating part 19 is formed in parts of the ohmic contact layers 16a and 16b, since the ohmic contact layers 16a and 16b are etched in the manufacturing process of the TFT 1.

Patterned to have a space therebetween (having the separating part 19 therebetween), the source electrode 17S and the drain electrode 17D are respectively formed on the ohmic contact layer16a and the ohmic contact layer 16b. Ohmic contacts are provided between the source electrode 17S and the ohmic contact layer 16a and between drain electrode 17D and the ohmic contact layer 16b. The source electrode 17S and the drain electrode 17D are formed directly in contact with the ohmic contact layer 16a and the ohmic contact layer 16b.

Each of the source electrode 17S and the drain electrode 17D is formed in a single layer structure or a multi layer structure and is made of a conductive material and an alloy. For example, each of the source electrode 17S and the drain electrode 17D is formed of (i) a single layer film made of metals such as titanium (Ti), tantalum (Ta), molybdenum (Mo), tungsten (W), aluminum (Al) and copper (Cu), and (ii) a laminated film made of two or more of the materials. Each of the source electrode 17S and the drain electrode 17D may have a film thickness of approximately 50 nm to 1000 nm inclusive. The source electrode 17S and the drain electrode 17D may be formed with the sputtering technique. Each of the source electrode 17S and the drain electrode 17D is formed of a metal layer including three layers of Mo/Al/Mo each having a thickness of 50 nm/300 nm/50 nm.

The TFT 1 is structured as described above.

Figure 2:
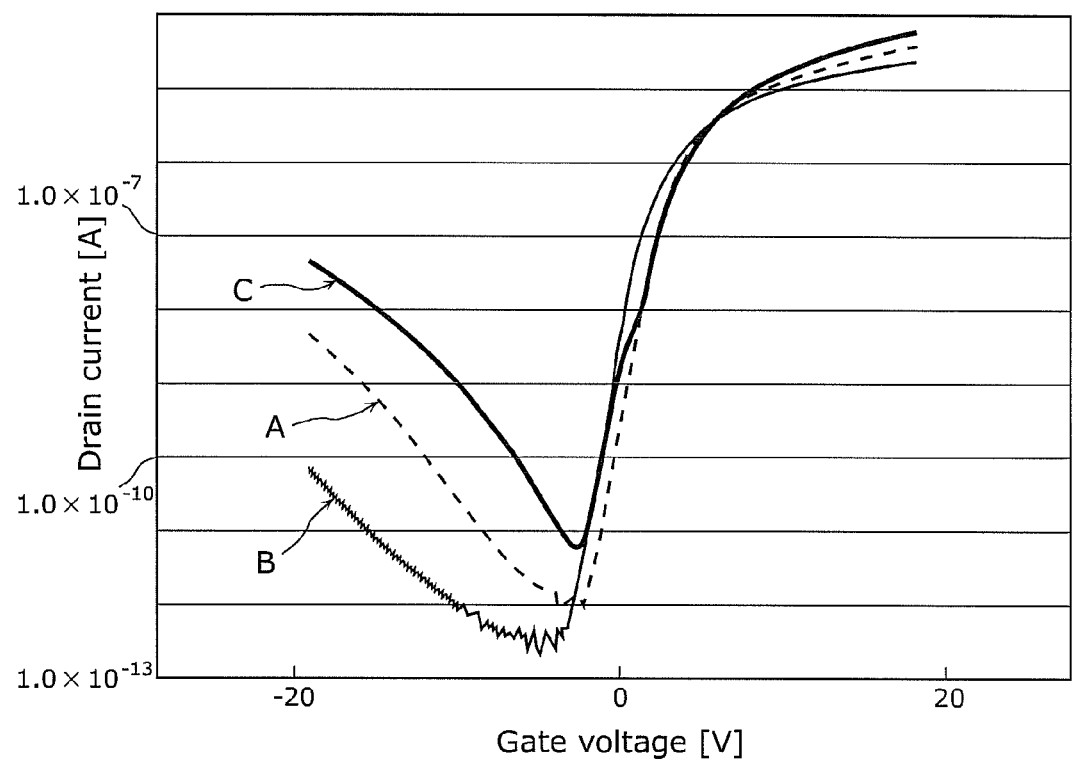
FIG. 2 shows I-V characteristics of the TFT according to Embodiment 1.

Described next are electrical characteristics of the TFT 1 structured above, with reference to FIG. 2. FIG. 2 shows I-V characteristics (Id–Vg) of the TFT according to Embodiment 1. In FIG. 2, "A" shows characteristics of the TFT 1 according to the Embodiment 1. "C" shows characteristics of a conventional TFT. As described above, the conventional TFT has an insulation film formed as an etching stopper film. Thus, the conventional TFT does not have equivalent for the second semiconductor layer 14. Furthermore, "B" shows characteristics of a TFT 2 according to Embodiment 2 described later. Moreover, in FIG. 2, the horizontal axis indicates a voltage value Vg [V] of a gate voltage at the gate terminal, and the vertical axis indicates a current value Id [A] of a drain current.

As shown in FIG. 2, the comparison shows that the TFT 1 ("A") according to Embodiment 1 has a slightly lower but almost the same on-state gate voltage as the conventional TFT ("C") has. On the other hand, the TFT 1 has an off-state gate voltage (Vg) lower than that of the conventional TFT. Accordingly, the off-current is of the TFT1 is low.

Thus, compared with the conventional TFT ("C"), the TFT 1 ("A") according to Embodiment 1 has the I-V characteristics which make the off-current lower.

Described hereinafter is the reason for the result that FIG. 2 shows.

In the off-state of the TFT 1 according to Embodiment 1, the carriers move between the source electrode 17S and the drain electrode 17D via the first semiconductor layer 13, the second semiconductor layer 14, and the ohmic contact layers 16a (16b). Specifically, in the off-state, the carriers travel from the drain electrode 17D to the source electrode 17S in the order of, for example, the ohmic contact layer 16b, the second semiconductor layer 14, the first semiconductor layer 13, the second semiconductor layer 14, and the ohmic contact layer 16a.

Here, (i) the ohmic contact layers 16a and 16b and (ii) the first semiconductor layer 13 which is formed of the crystalline silicon film are not in direct contact with each other. Instead, the second semiconductor layer 14 is provided between (i) the ohmic contact layers 16a and 16b and (ii) the first semiconductor layer 13. This structure alleviates concentration of the electric fields between the first semiconductor layer 13 and the ohmic contact layers. Thus, the TFT 1 can reduce a leakage current in the off-state. This structure successfully provides a TFT capable of reducing the off-current.

Hence, the second semiconductor layer 14 in the off-state contributes to reducing the leakage current. The second semiconductor layer 14 in the on-state, however, is a resistance component to the ohmic contact layers 16a and 16b, and to the first semiconductor layer 13. In other words, the second semiconductor layer 14 in the on-state could be a cause to lower the on-current. However, the second semiconductor layer 14 of the TFT 1 according to the Embodiment 1 has the first thickness t1 and the second thickness t2 as shown in FIG. 1. Thus, in the on-state, the carriers can move via the first thickness t1. In other words, the second semiconductor layer 14 is capable of functioning to the degree where no unwanted effect is developed as a resistance component. In addition, having the second thickness t2, the second semiconductor layer 14 can work as a buffer layer to alleviate the concentration of the electric fields between the first semiconductor layer 13 and the ohmic contact layers.

Thus, the TFT 1 according to Embodiment 1 is effective in reducing the off-current while ensuring the on-current.

Described next is a method of manufacturing the TFT 1 according to Embodiment 1. FIGS. 3A to 3E depict cross-sectional views showing each step in the manufacturing process of the TFT 1 according to Embodiment 1.

Figure 3A:
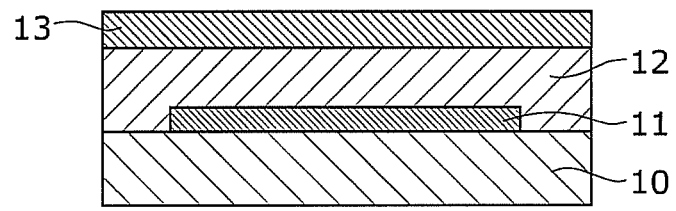
FIG. 3A depicts a cross-sectional view showing a step in a manufacturing process of the TFT according to Embodiment 1.

First, as shown in FIG. 3A, the gate electrode 11 is formed above the supporting substrate 10 with, for example, the sputtering technique. Next, the formed gate electrode 11 is processed with photolithography and etched. Thus, the gate electrode 11 is patterned on the supporting substrate 10. Then, with the plasma CVD technique for example, the gate insulation film 12 is formed over the supporting substrate 10 so that the gate insulation film 12 covers the gate electrode 11. The gate insulation film 12 is formed of a silicon dioxide film. Next, on the gate insulation film 12, the first semiconductor layer 13 is formed with a film thickness of, for example, 30 nm. The first semiconductor layer 13 is formed of an amorphous silicon film, for example. Then, the first semiconductor layer 13, which is formed of the amorphous silicon film with the plasma CVD technique for example, is crystallized with a technique such as the laser annealing (LA) technique or the rapid thermal annealing (RTA). Hence, the first semiconductor layer 13 is formed of the crystalline silicon film.

Figure 3B:
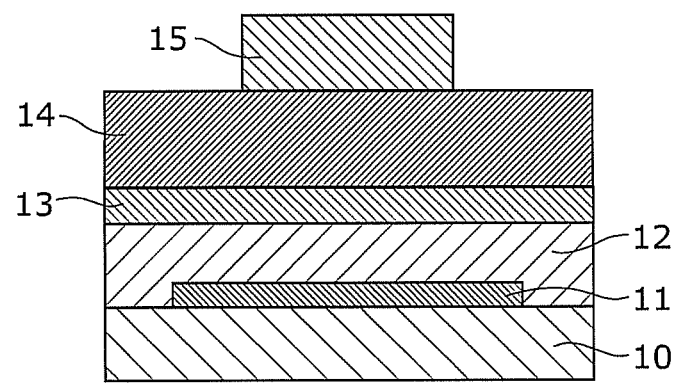
FIG. 3B depicts a cross-sectional view showing a step in the manufacturing process of the TFT according to Embodiment 1.

Next, as shown in FIG. 3B, the second semiconductor layer 14 is formed with the plasma CVD technique, for example, to cover the first semiconductor layer 13. Then, a resist mask 15 is applied to the second semiconductor layer 14 in order to process (to pattern) the second semiconductor layer 14.

Figure 3C:
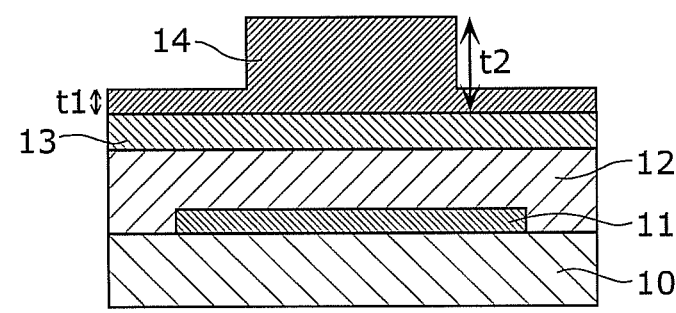
FIG. 3C depicts a cross-sectional view showing a step in the manufacturing process of the TFT according to Embodiment 1.

Next, as shown in FIG. 3C, the second semiconductor layer 14 is etched to the degree that the first semiconductor layer 13 is not exposed. Then, the resist mask 15 is removed. In other words, a part of the second semiconductor layer 14 with no resist mask 15 applied is etched such that the part has the first thickness t1. A part of the second semiconductor layer 14 with the resist mask 15 applied is not etched such that the part has the second thickness t2. Here, the second semiconductor layer 14 is etched with the dry etching technique. The etching gas is, for example, a gas including fluorine (F), a gas including chlorine (Cl), or a mixed gas including fluorine (F) and chlorine (Cl).

It is noted that examples of processing (patterning) the second semiconductor layer 14 to provide the first thickness t1 and the second thickness t2 thereon shall not be limited to the above technique. For example, a part of the second semiconductor layer 14 with no resist mask 15 applied is etched, and part of the first semiconductor layer 13 is exposed. Then, with the plasma CVD technique, the second semiconductor layer 14 is formed to have the first thickness t1 and the second thickness t2.

Figure 3D:
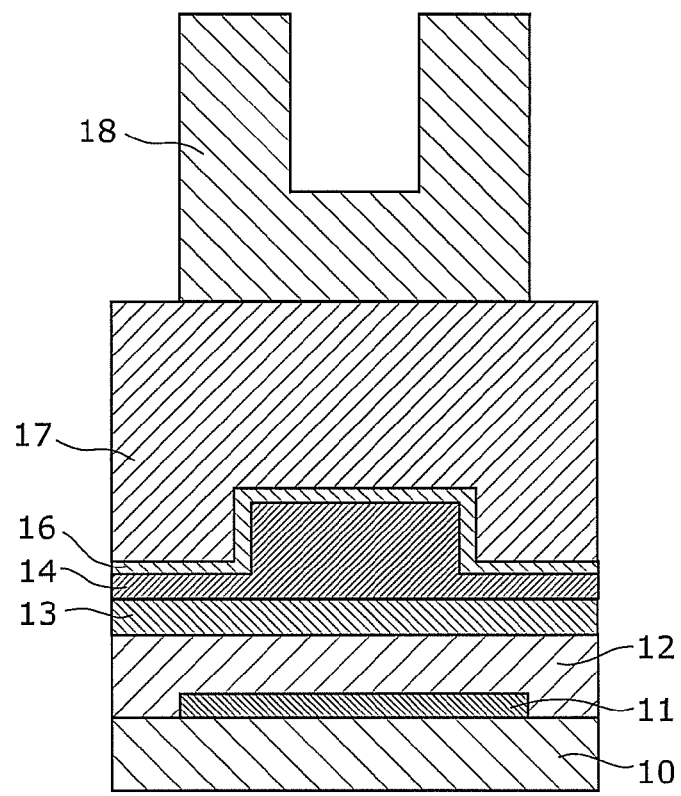
FIG. 3D depicts a cross-sectional view showing a step in the manufacturing process of the TFT according to Embodiment 1.

Next, as shown in FIG. 3D, the ohmic contact layer 16 and a source and drain metal film 17 are formed. Then, on the source and drain metal film 17, a resist mask 18 is patterned.

Figure 3E:
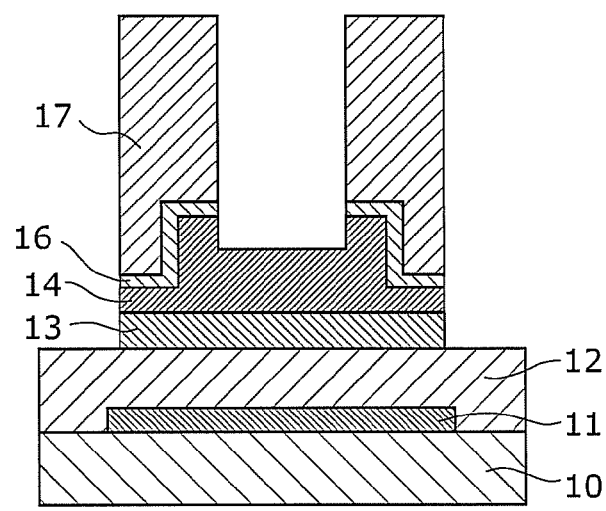
FIG. 3E depicts a cross-sectional view showing a step in the manufacturing process of the TFT according to Embodiment 1.

Then, as shown in FIG. 3E, the source and drain metal film 17, the ohmic contact layer 16, and the second semiconductor layer 14 are etched. The source electrode 17S, the drain electrode 17D, and the ohmic contact layers 16a and 16b are separately formed. Then, the resist mask 18 is removed.

Here, the source and drain metal film 17 is etched with the wet etching technique, for example. The wet etching liquid is a mixed liquid of phosphoric acid, nitric acid, and acetic acid in the case where the source and drain metal film 17 is a laminated film made of molybdenum (Mo) and aluminum (Al). The ohmic contact layer 16, the second semiconductor layer 14, and the first semiconductor layer 13 are etched with the dry etching technique, for example. The etching gas is a gas including chlorine (Cl), a gas including fluorine (F), or a mixed gas including chlorine (Cl) and fluorine (F).

The TFT 1 is manufactured through the above manufacturing process.

Embodiment 2

Figure 4:
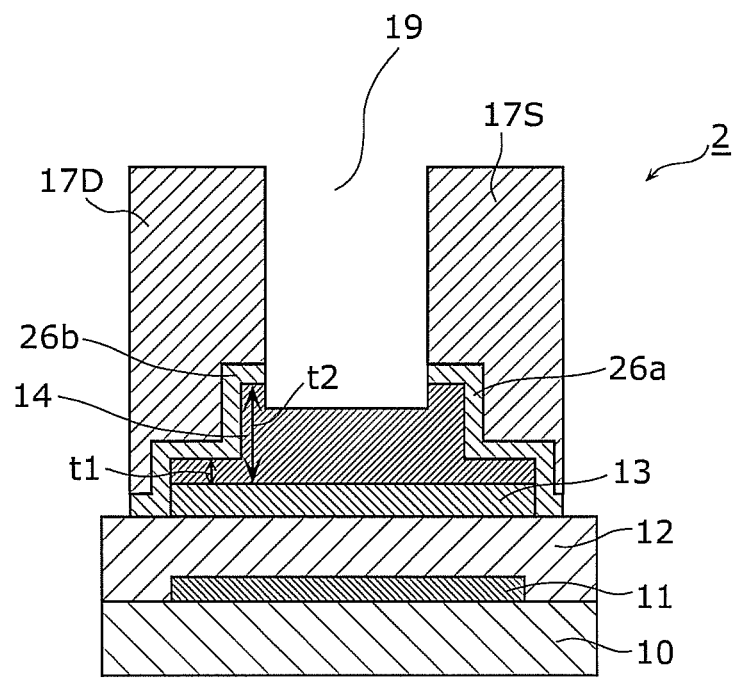
FIG. 4 depicts a cross-sectional view of a TFT according to Embodiment 2.

Described next is a TFT 2 according to Embodiment 2 with reference to FIG. 4. FIG. 4 depicts a cross-sectional view of the TFT 2 according to Embodiment 2.

The TFT 2 in FIG. 4 is n-type and bottom-gated. The TFT 2 includes: the supporting substrate 10, the gate electrode 11 formed above the supporting substrate 10, the gate insulation film 12 formed over the gate electrode 11, the first semiconductor layer 13 and the second semiconductor layer 14 formed above the gate insulation film 12, a pair of ohmic contact layers 26a and 26b each separately formed above the first semiconductor layer 13 and the second semiconductor layer 14, and a source electrode 17S and a drain electrode 17D respectively formed on the pair of the ohmic contact layers 26a and 26b.

The TFT 2 in FIG. 4 differs from the TFT 1 in FIG. 1 in its structure of the ohmic contact layers 26a and 26b.

Compared with the ohmic contact layers 16a and 16b of the TFT 1 in FIG. 1, the ohmic contact layers 26a and 26b are formed so as to cover the sidewalls of the semiconductor layers; namely, the sidewalls of the first semiconductor layer 13 and the second semiconductor layer 14.

In other words, the ohmic contact layers 26a and 26b are provided to coat, in a channel length direction, sides of both end portions of the first semiconductor layer 13 and the second semiconductor layer 14.

Similar to the TFT 1, moreover, the TFT 2 includes the separating part 19 for separating (i) the source electrode 17S and the drain electrode 17D, (ii) the ohmic contact layers 26a and 26b, and (iii) a part of the second semiconductor layer 14.

Described next is electrical characteristics of the TFT 2 structured above, with reference to FIG. 2.

As shown in FIG. 2, the comparison shows that the TFT 2 ("B") according to Embodiment 2 has a slightly lower but almost the same on-state gate voltage as the conventional TFT ("C") has. On the other hand, the TFT 2 has an off-state gate voltage (Vg) lower than that of the conventional TFT. Accordingly, the off-current of the TFT2 is low. The comparison shows that the on-state gate voltage (Vg) of the TFT 2 ("B") according to Embodiment 2 is slightly higher than that of the TFT 1 ("A") according to Embodiment 1. On the other hand, the off-state gate voltage (Vg) of the TFT 2 is lower than that of the TFT 1. Accordingly, the off-current of the TFT2 is low.

Thus, compared with the conventional TFT 1 ("A") according to Embodiment 1, the TFT 2 ("C") according to Embodiment 2 has the I-V characteristics which make the off-current even lower.

Described hereinafter is the reason why the on-characteristics of the TFT 2 shows improvements over those of the TFT 1. In TFT 1, the second semiconductor layer 14 in on-state works as a resistance component for the ohmic contact layers 26a and 26b and the first semiconductor layer 13 even though its effect as the resistance component might be little. In contrast, the TFT 2 has the ohmic contact layers 26a and 26b formed so as to cover the sidewalls of the first semiconductor layer 13 and the second semiconductor layer 14. This structure allows the ohmic contact layers 26a and 26b to make direct contact with the first semiconductor layer 13.

Thus, the TFT 2 according to Embodiment 2 is effective in reducing the off-current while ensuring the on-current.

It is noted that as shown in FIG. 4, the length (Lgm) of the gate electrode 11 is greater than the separation distance (Lch) between the source electrode 17S and the drain electrode 17D. The gate electrode 11 may also be designed to have a greater Lgm than the length (Lsi) of the first semiconductor layer 13.

Here, electric fields from the gate electrode 11 are applied to the regions, of the first semiconductor layer 13, with which the ohmic contact layer 26a and 26b make direct contact. As a result, Ron resistance is successfully reduced.

Described next is a manufacturing method of the TFT 2 structured above.

FIGS. 5A to 5E depict cross-sectional views showing each step in the manufacturing process of the TFT 2 according to Embodiment 2.

Figure 5A:
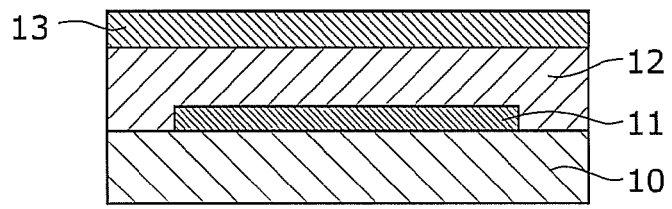
FIG. 5A depicts a cross-sectional view showing a step in a manufacturing process of the TFT according to Embodiment 2.

First, as shown in FIG. 5A, the gate electrode 11, the gate insulation film 12, and the first semiconductor layer 13 are formed above the supporting substrate 10. The details are similar to those in FIG. 3A, and description thereof shall be omitted.

Figure 5B:
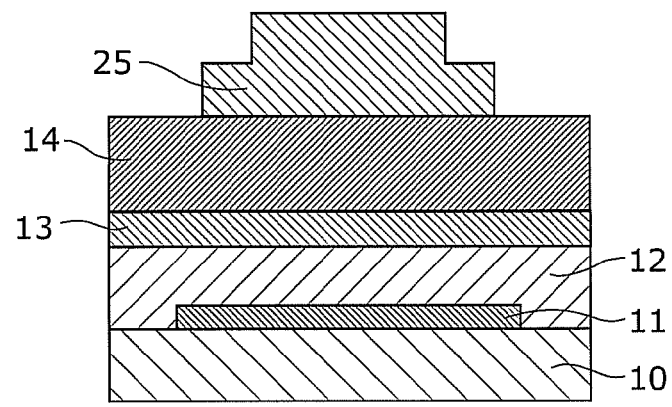
FIG. 5B depicts a cross-sectional view showing a step in the manufacturing process of the TFT according to Embodiment 2.

Next, as shown in FIG. 5B, the second semiconductor layer 14 and a resist mask 25 for processing the second semiconductor layer 14 are formed. The details are similar to those in FIG. 313, and description thereof shall be omitted. The resist mask 25 is formed as a high-tone mask such as a half-tone mask.

Figure 5C:
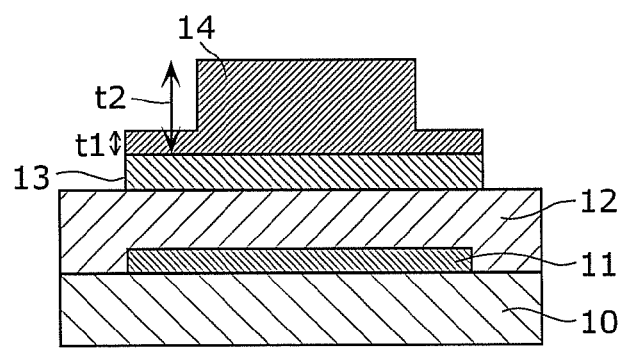
FIG. 5C depicts a cross-sectional view showing a step in the manufacturing process of the TFT according to Embodiment 2.

Then, as shown in FIG. 5C, some portions with no resist mask 25 applied are removed together with the second semiconductor layer 14 and the first semiconductor layer 13. Here, portions of the second semiconductor layer 14 with no resist mask 25 applied are etched to have the first thickness t1. In other words, the half-ashing is performed on the resist mask 25 to remove some of the resist mask 25. This process provides the resist mask 25 portions having a thinner film thickness. Next, using the resist mask 25 on which the half-ashing is performed, the second semiconductor layer 14 is etched to have the first thickness t1 and the second thickness t2. Here, the second semiconductor layer 14 is etched with the dry etching technique, for example. The etching gas is, for example, a gas including fluorine (F), a gas including chlorine (Cl), or a mixed gas including fluorine (F) and chlorine (Cl).

Figure 5D:
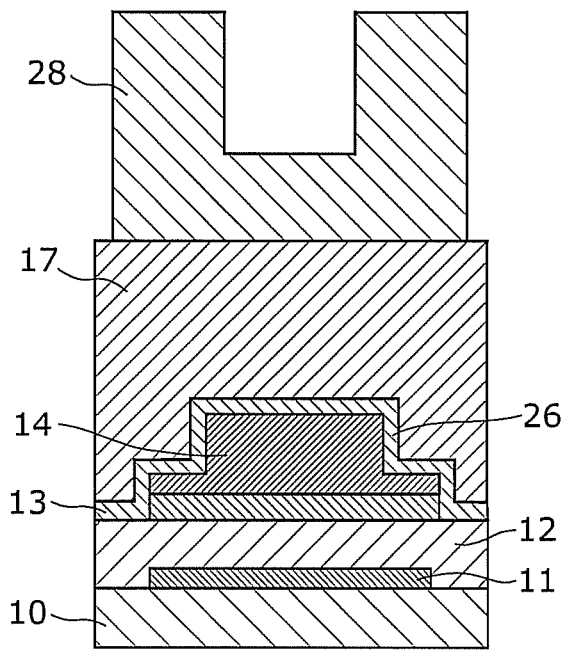
FIG. 5D depicts a cross-sectional view showing a step in the manufacturing process of the TFT according to Embodiment 2.

Next, as shown in FIG. 5D, an ohmic contact layer 26 and the source and drain metal film 17 are formed. Then, on the source and drain metal film 17, a resist mask is 28 patterned. Here, the ohmic contact layer 26 is not only formed on the second semiconductor layer 14, but also formed to coat the sidewalls of the first semiconductor layer 13 and the second semiconductor layer 14.

Figure 5E:
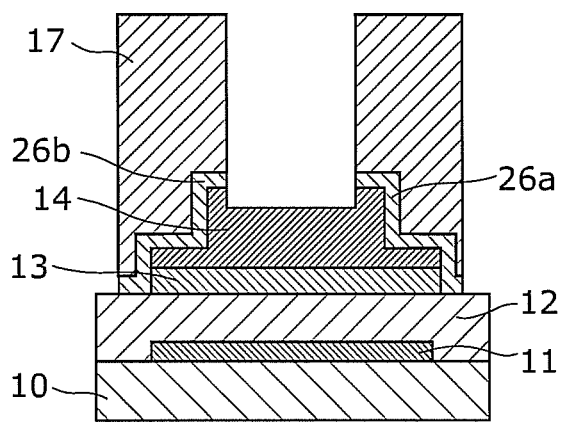
FIG. 5E depicts a cross-sectional view showing a step in the manufacturing process of the TFT according to Embodiment 2.

Then, as shown in FIG. 5E, the source and drain metal film 17, the ohmic contact layer 26, and the second semiconductor layer 14 are etched. The source electrode 17S, the drain electrode 17D and the ohmic contact layers 26a and 26b are separately formed. Then, the resist mask 28 is removed. The details are similar to those in FIG. 3E, and description thereof shall be omitted.

Embodiment 3

Figure 6:
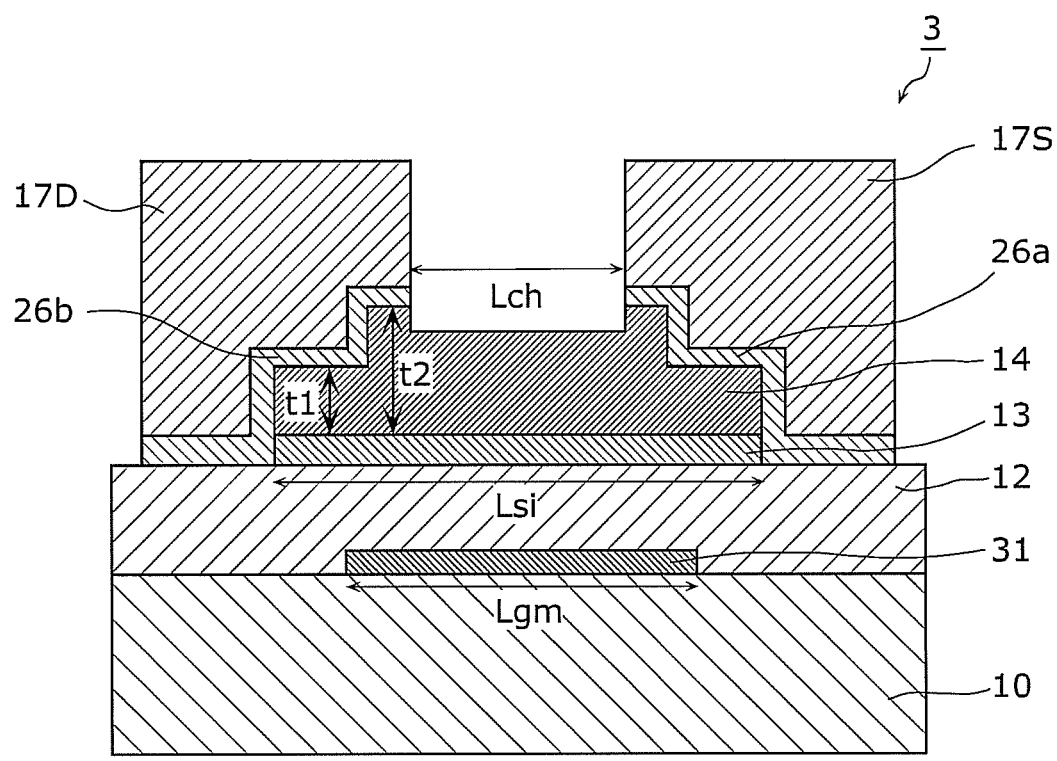
FIG. 6 depicts a cross-sectional view of a TFT according to Embodiment 3.

Described next is a TFT 3 according to Embodiment 3 with reference to FIG. 6. FIG. 6 depicts a cross-sectional view of a TFT according to Embodiment 3. It is noted that identical constituent features between FIGS. 1 and 4 share the same reference signs, and details thereof shall be omitted.

The TFT 3 in FIG. 6 and the TFT 2 in FIG. 4 share the basic structure. The TFT 3 in FIG. 6 differs from the TFT 2 in FIG. 4 in the length (Lgm) of a gate electrode 31. Other than that, the structure of the TFT 3 is the same as that of the TFT 2 in Embodiment 2.

The length (Lgm) of the gate electrode 31 in the TFT 3 in FIG. 6 is (i) longer than the length (Lch) of the separating part 19 provided between the source electrode 17S and the drain electrode 17D, and (ii) shorter than the length (Lsi) of the first semiconductor layer 13.

This structure successfully reduces parasitic capacitance (Cgd or Cgs) between the gate electrode 31 and the source electrode 17S (or the drain electrode 17D). Hence, the use of the TFT 3 as a switching transistor for a pixel in a display apparatus, for example, is effective in the prevention of a voltage jump via the parasitic capacitance, when the gate electrode 31 goes from ON to OFF.

It is noted that, regarding a travel of the carriers, the TFT according to Embodiment 3 achieves an effect similar to that of the TFT 1 according to Embodiment 1.

Furthermore, the structure of the TFT 3 according to Embodiment 3 is also applicable to the TFT 1 according to Embodiment 1, as well as to the TFT 2 according to Embodiment 2.

Embodiment 4

Figure 7:
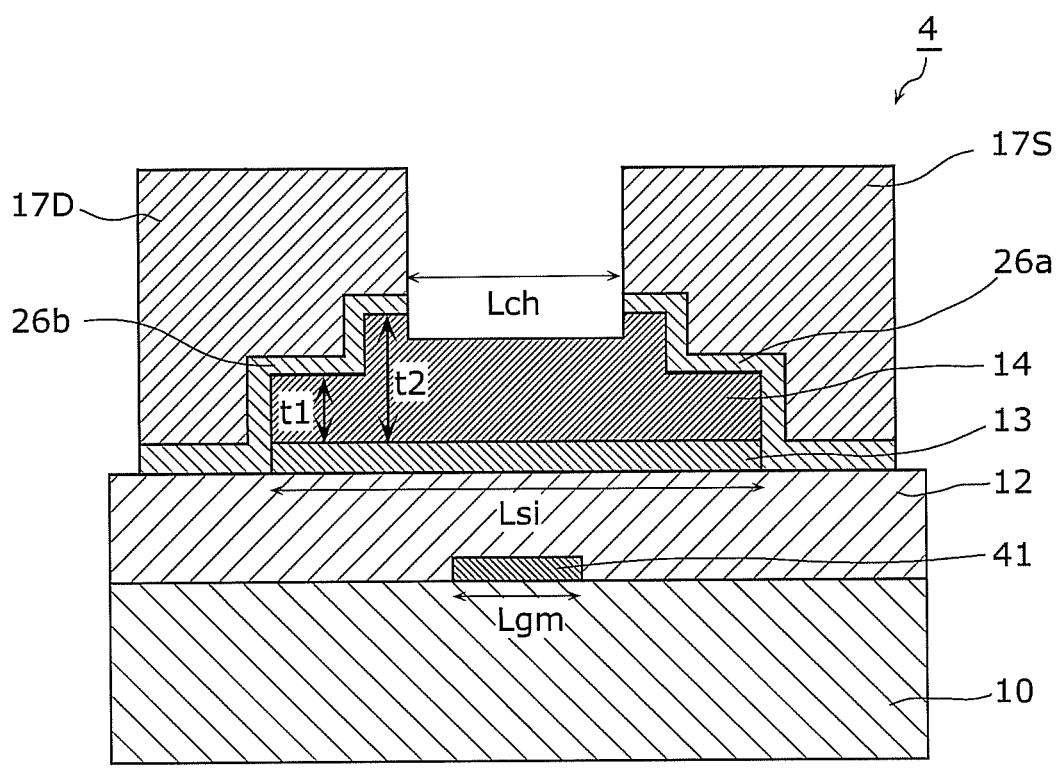
FIG. 7 depicts a cross-sectional view of a TFT according to Embodiment 4.

Described next is a TFT 4 according to Embodiment 4 with reference to FIG. 7. FIG. 7 depicts a cross-sectional view of the TFT 4 according to Embodiment 4. It is noted that identical constituent features among FIGS. 1, 4, and 7 share the same reference signs, and details thereof shall be omitted.

The TFT 4 in FIG. 7 and the TFT 2 in FIG. 4 share the basic structure. The TFT 4 in FIG. 7 differs from the TFT 2 in FIG. 4 in the length (Lgm) of a gate electrode 41. Other than that, the structure of the TFT 4 is the same as that of the TFT 2 in Embodiment 2.

The length (Lgm) of the gate electrode 41 of the TFT 4 in FIG. 7 is shorter than (i) the length (Lsi) of the first semiconductor layer 13 and (ii) the length (Lch) of the separating part provided between the source electrode 17S and the drain electrode 17D.

Thus, in a direction perpendicular to the substrate in the TFT 4, the gate electrode 41 does not intersect with the source electrode 17S (or the drain electrode 17D), and there is no area where the gate electrode 41 and the source electrode 17S (or the drain electrode 17D) overlaps with each other.

Due to the structure, a short circuit failure between the gate electrode 41 and the source electrode 17S (or the drain electrode 17D) hardly occurs.

Compared with the TFT 2 according to Embodiment 2, the TFT 4 can further reduce the off-current. It is noted that the first semiconductor layer 13 is preferably formed of the crystalline silicon film having high mobility.

Furthermore, the structure of the TFT 4 according to Embodiment 4 is also applicable to the TFT 1 according to Embodiment 1, as well as to the TFT 2 according to Embodiment 2.

Embodiment 5

Described next is the case where the TFTs according to Embodiments 1 to 4 are applied to a display apparatus. It is noted that Embodiment 5 exemplifies the case where the TFTs are applied to an organic EL apparatus.

Figure 8:
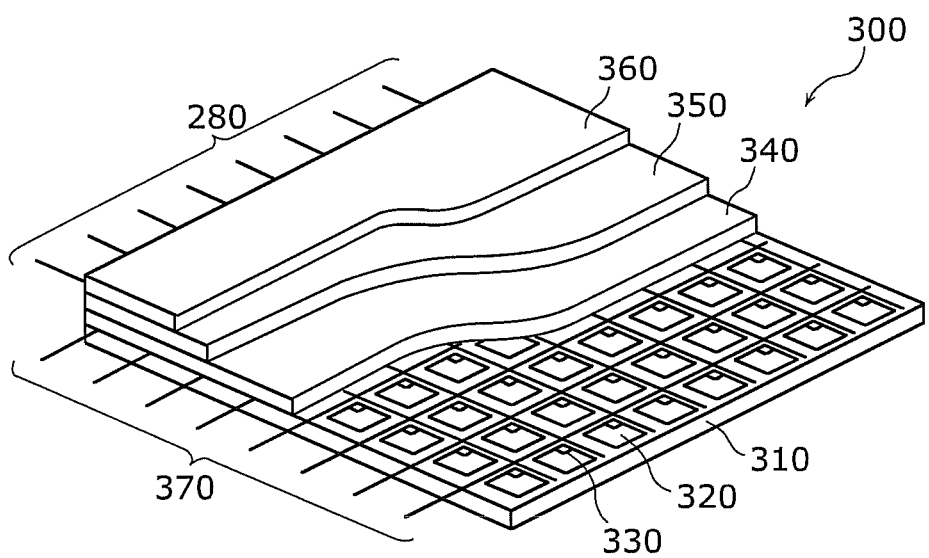
FIG. 8 depicts a cutaway view of an organic EL apparatus according to Embodiment 5.

FIG. 8 depicts a cutaway view of an organic EL apparatus according to Embodiment 5. The TFT according to each of the embodiments may be used as a driving transistor or as a switching transistor provided on an active matrix substrate of the organic EL apparatus.

As shown in FIG. 8, an organic EL apparatus 300 includes: an active matrix substrate 310; pixels 320 arranged in a matrix on the active matrix substrate 310; pixel circuits 330 (i) arranged in arrays on the active matrix substrate 310 and (ii)

each of which is connected to a corresponding one of the pixels 320; a lower electrode 340 (anode), an organic EL layer 350, and an upper electrode 360 (cathode) sequentially laminated on the pixels 320 and the pixel circuits 330; and source lines 370 and gate lines 380 which connect each of the pixel circuits 330 with a control circuit (not shown). An electron transport layer, a luminescent layer, and a hole transport layer are laminated to form the organic EL layer 350.

Figure 9:
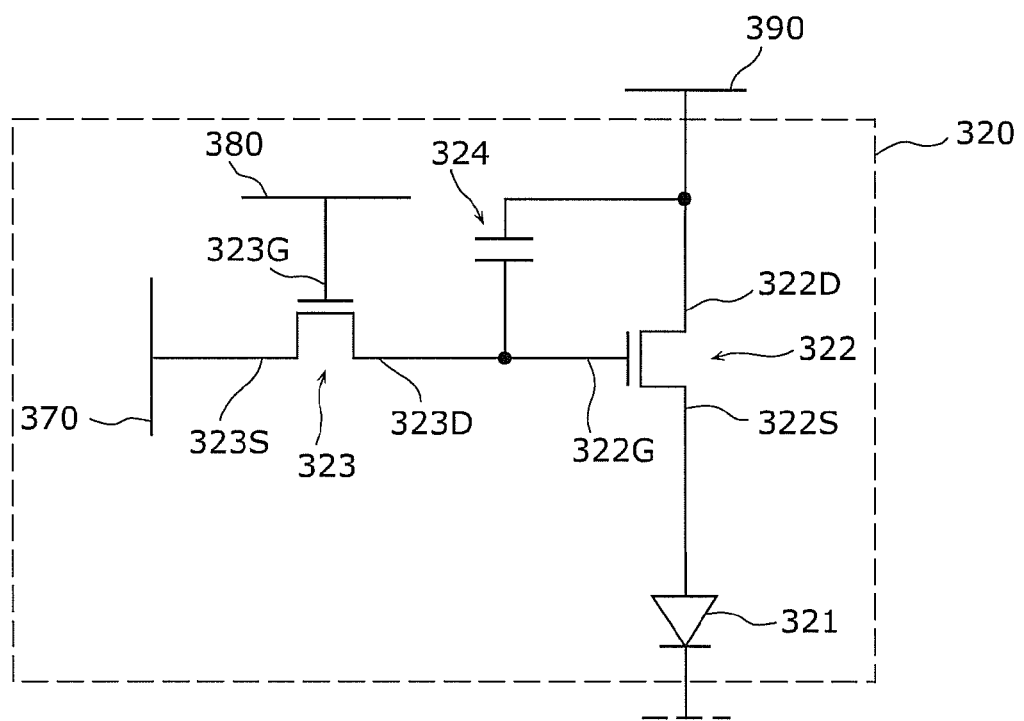
FIG. 9 depicts a circuit diagram of a pixel including any one of the TFTs in Embodiments 1 to 4.

Described next is a circuit structure of the pixel 320 included in organic EL apparatus 300 with reference to FIG. 10. FIG. 9 depicts a circuit diagram of a pixel using any one of the TFTs in Embodiments 1 to 4.

As shown in FIG. 9, each of the pixels 320 includes: an organic EL element 321; a driving transistor 322 for controlling a luminescence amount of the organic EL element 321; a switching transistor 323 for controlling driving timing, such as on and off of the organic EL device 321, and a capacitor 324. It is noted that any one of the TFTs according to Embodiments 1 to 4 is used as the driving transistor 322 or the switching transistor 323.

The switching transistor 323 has (i) a source electrode 323S connected to a corresponding one of the source lines 370, (ii) a gate electrode 323G connected to a corresponding one of the gate lines 380, and (iii) a drain electrode 323D connected to a gate electrode 322G of the driving transistor 322 and to the capacitor 324.

Furthermore, the driving transistor 322 has (i) a drain electrode 322D connected to a power supply line 390, and (ii) a source electrode 322S connected to an anode of the organic EL element 321.

When a gate signal is provided to the gate line 380 and the switching transistor 323 turns on, a signal voltage supplied via the source lines 370 is written to the capacitor 324. Then, the hold voltage written to the capacitor 324 is held for one frame period. This hold voltage analogously changes the conductance of the driving transistor 322. A driving current corresponding to a luminous gradation runs from the anode to the cathode of the organic EL element 321. This causes the organic EL element 321 to emit light, and an image is displayed.

Further detailed next is the case where the TFTs according to Embodiments 1 to 4 are used as driving transistors or the switching transistors of the pixels in the organic EL apparatus.

Figure 10:
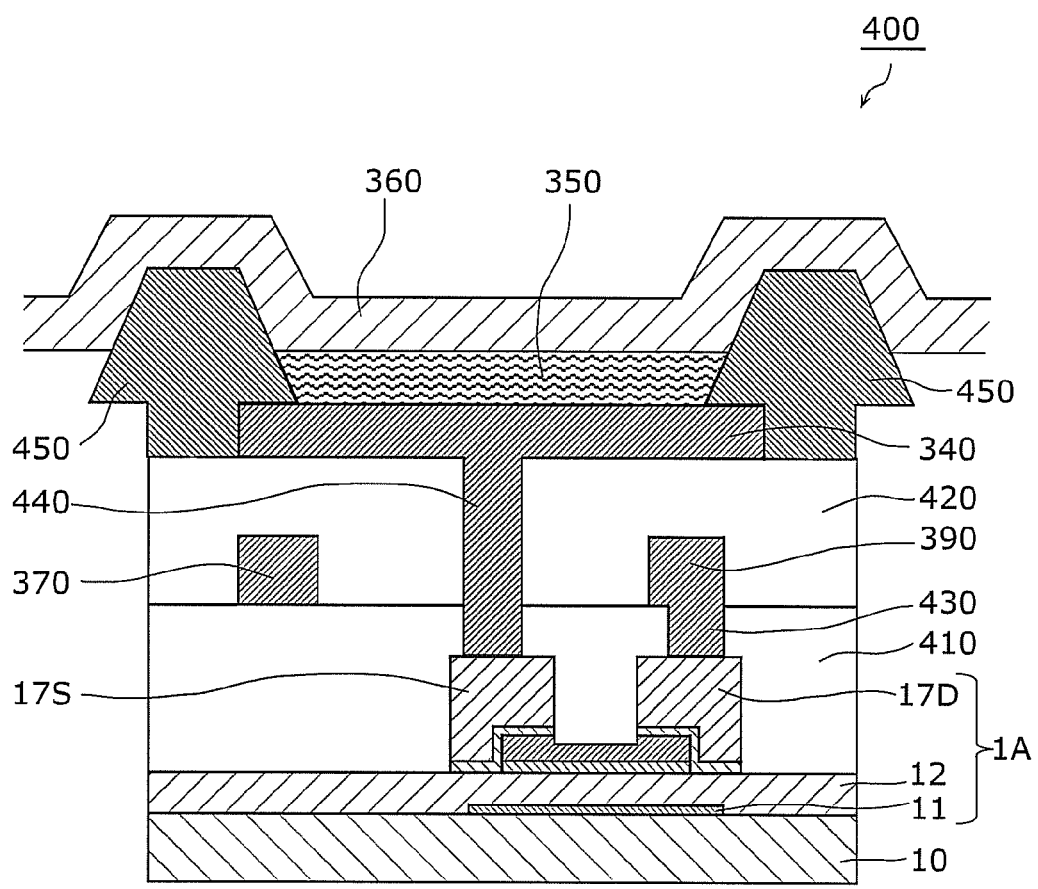
FIG. 10 depicts a cross-sectional view of a pixel included in the organic EL apparatus when a TFT 2 according to Embodiment 2 is used as a driving transistor.

FIG. 10 depicts a cross-sectional view of a pixel included in the organic EL apparatus when the TFT 2 according to Embodiment 2 is used as a driving transistor.

As shown in FIG. 10, an organic EL apparatus 400 according to Embodiment 5 includes: the supporting substrate 10 which is a TFF array substrate and has a driving transistor 1A and a switching transistor (not shown) formed thereon; and a first interlayer insulation film 410, a second interlayer insulation film 420, a first contact part 430, a second contact part 440, and a bank 450 which are formed above the supporting substrate 10. Furthermore, the organic EL apparatus 400 includes the lower electrode 340, the organic EL layer 350, and the upper electrode 360 as shown in FIG. 8.

As shown in FIG. 10, the first interlayer insulation film 410 is formed so as to cover the driving transistor 1A. The source line 370 and the power supply line 390 are formed on the first interlayer insulation film 410. The power supply line 390 and the drain electrode 17D of the driving transistor 1A are electrically connected with each other via first contact part 430 which penetrates the first interlayer insulation film 410. Moreover, the second interlayer insulation film 420 is formed so as to cover the source line 370 and the power supply line 390.

On the second interlayer insulation film 420, the bank 450 is formed on the boarder of a neighboring pixel. Accordingly, there are multiple banks 450 formed on the supporting substrate 10. Thus, a pair of the adjacent banks 450 forms an opening. Formed in the opening of the banks 450 is the organic EL element 321 including the lower electrode 340, the organic EL layer 350, and the upper electrode 360.

The lower electrode 340 is an anode provided to each pixel, and formed on the second interlayer insulation film 420. The lower electrode 340 and the source electrode 17S of the driving transistor 1A are electrically connected with each other via second contact part 440 which penetrates the first interlayer insulation film 410 and the second interlayer insulation film 420.

An organic EL layer 350 is formed for each color (sub-pixel column) or each sub-pixel, and, as described above, is made of a predetermined organic EL material.

Provided above the organic EL layer 350, the upper electrode 360 is a cathode which is formed over two or more of the pixels. The upper electrode 360 is formed of a transparent electrode made of indium tin oxide (ITO).

As described above, the organic EL apparatus 400 including the TFT 2 according to Embodiment 2 has excellent display performance because the TFTs according to Embodiment 5 have excellent transistor characteristics.

It is noted that Embodiment 5 shows the case where the TFT 2 according to Embodiment 2 is used as a driving transistor. A TFT according to another embodiment of the present invention may also be used as a driving transistor.

Furthermore, Embodiment 5 shows the case where the TFT 2 according to Embodiment 2 is applied to a driving transistor. Concurrently, the TFT 2 may be applied to a switching transistor.

Although only some exemplary embodiments of the TFTs, manufacturing methods thereof, and a display apparatus including the TFTs according to implementations of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, an organic EL display apparatus has been exemplified, but not limited, as a display apparatus in the present invention. The TFTs according to Embodiments 1 to 4 may be applied to a display apparatus including another display element, such as an inorganic EL display element and a liquid crystal display element.

Figure 11:
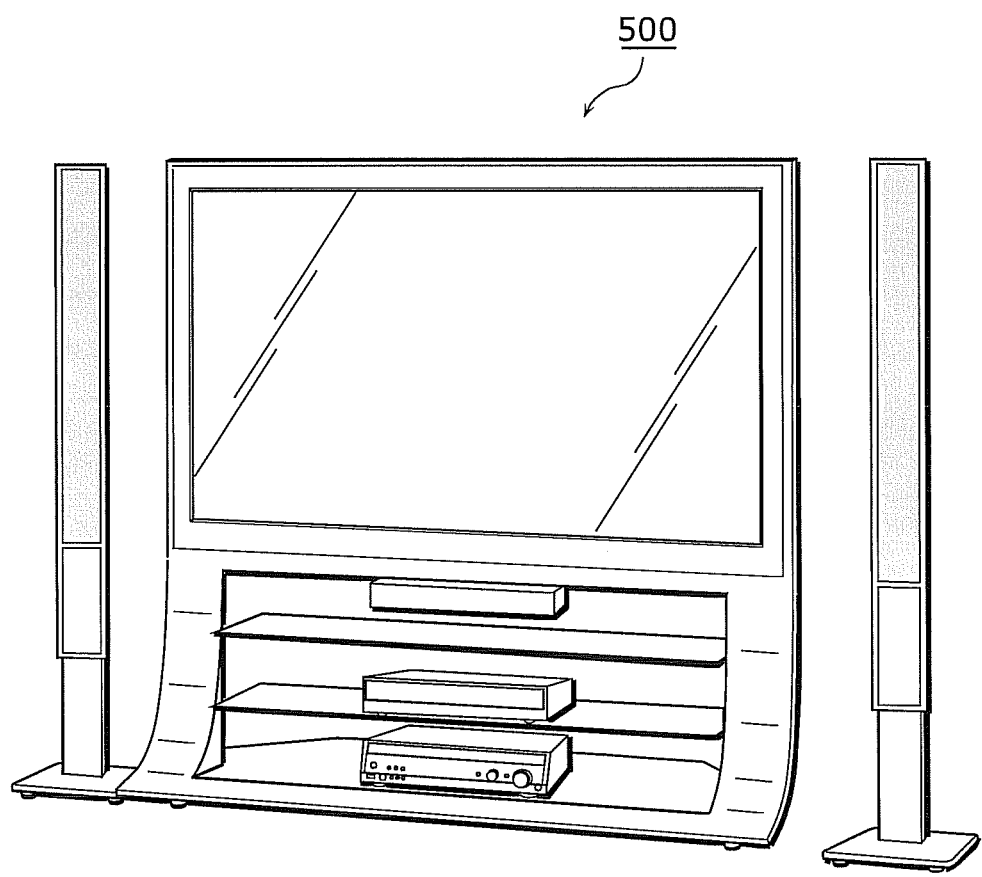
FIG. 11 depicts an outline view of a TV set including a display apparatus according to the embodiments of the present invention.

In addition, a display apparatus including the TFTs according to the embodiments of the present invention may be used as a flat panel display. For example, the display apparatus may be used as a TV set 500 in FIG. 11, and as various types of displays for, such as, personal computers and cellular phones.

Moreover, two or more switching transistors may be provided to each pixel in a display apparatus in order to reduce performance variations among TFTs and secure the performance and the life of the display apparatus. In such a case, there is no significant change in manufacturing methods of the TFTs according to Embodiments 1 to 4. A change of mask patterns alone makes it possible to form different transistors on a single substrate. Accordingly, a combination of the TFTs according to the embodiments of the present invention or a combination of a TFT in the present invention and a conventional TFT in a single pixel or in a display apparatus can provide an organic EL display apparatus with simple designing.

INDUSTRIAL APPLICABILITY

A TFT and a display apparatus according an implementation of the present invention is widely applicable to, for example, electric appliances equipped with a display apparatus including (i) a liquid crystal display apparatus and an EL display apparatus, (ii) a TV set including the display apparatuses, and (iii) a display apparatus for a personal computer or a cellular phone.

What is claimed is:

1. A thin-film transistor (TFT) comprising:
a substrate;
a gate electrodes disposed above said substrate;
a gate insulation film disposed on said substrate so as to cover said gate electrode;
a first semiconductor layer disposed across from said gate electrode with respect to said gate insulation film;
a second semiconductor layer disposed on said first semiconductor layer, and having a first portion with a first thickness and a second portion with a second thickness, the second thickness being greater than the first thickness;
an ohmic contact layer disposed on said second semiconductor layer; and
a source electrode and a drain electrode disposed on said ohmic contact layer, said source electrode and said drain electrode being spaced apart from each other.

2. The TFT according to claim 1,
wherein the second portion is a center portion of the second semiconductor layer, and
the first portion is an end portion of said second semiconductor layer.

3. The TFT according to claim 1,
wherein a difference between the first thickness and the second thickness is from 50 nm to 300 nm inclusive.

4. The TFT according to claim 1,
wherein said second semiconductor layer is formed in a projected shape having the first portion and the second portion.

5. The TFT according to claim 1, further comprising
a separating part separating said source electrode and said drain electrode from each other,
wherein said second semiconductor layer has a part of said separating part formed in a center portion of said second semiconductor layer.

6. The TFT according to claim 1,
wherein said second semiconductor layer is a buffer layer.

7. The TFT according to claim 1,
wherein said second semiconductor layer is an amorphous silicon film.

8. The TFT according to claim 1,
wherein said second semiconductor layer and said ohmic contact layer share an interface with each other, and said second semiconductor layer and said first semiconductor layer share an interface with each other.

9. The TFT according to claim 1,
wherein said second semiconductor layer has a lower mobility of carriers than said first semiconductor.

10. The TFT according to claim 1,
wherein said ohmic contact layer coats sides of both end portions of said first semiconductor layer and said second semiconductor layer in a channel length direction.

11. The TFT according to claim 1,
wherein, in a cross section of said TFT perpendicular to said substrate, said gate electrode is longer than a width of said separating part between said source electrode and said drain electrode.

12. The TFT according to claim 11,
wherein said first semiconductor layer is longer than said gate electrode.

13. The TFT according to claim 1,
wherein, in a cross section of said TFT perpendicular to said substrate, a width of said separating part between said source electrode and said drain electrode is longer than said gate electrode.

14. A display apparatus comprising said TFT according to claim 1.

15. A method for manufacturing a TFT, said method comprising:
forming a gate electrode above a substrate;
forming a gate insulation film on the substrate so as to cover the gate electrode;
forming a first semiconductor layer across from the gate electrode with respect to the gate insulation film;
forming a second semiconductor layer on the first semiconductor layer, the second semiconductor layer having a first portion with a first thickness and a second portion with a second thickness, the second thickness being greater than the first thickness;
forming an ohmic contact layer on the second semiconductor layer; and
forming, on the ohmic contact layer, a source electrode and a drain electrode being spaced apart from each other.

16. The method for manufacturing the TFT according to claim 15,
wherein said forming the second semiconductor includes
forming of the second semiconductor layer having the second portion,
applying a photoresist mask to a part of the second semiconductor layer, and
etching the second semiconductor layer so as to form the second semiconductor layer having the first portion and the second portion.

* * * * *